United States Patent [19]

McBride et al.

[11] Patent Number: 4,652,345

[45] Date of Patent: Mar. 24, 1987

[54] METHOD OF DEPOSITING A METAL FROM AN ELECTROLESS PLATING SOLUTION

[75] Inventors: Donald G. McBride, Binghamton; Robert G. Rickert, Jr., Johnson City, both of N.Y.

[73] Assignee: International Business Machines Corporation, Armonk, N.Y.

[21] Appl. No.: 562,550

[22] Filed: Dec. 19, 1983

[51] Int. Cl.$^4$ .................. C25D 3/02; C25D 3/12; C25D 3/30; C25D 3/52

[52] U.S. Cl. ................... 204/14.1; 204/20; 204/47; 204/49; 204/45.1; 204/52.1; 204/54.1

[58] Field of Search .......... 204/20, 22, 30, 52 R, 204/52 Y, 290 R, 248, 249, 14.1, 47, 45.1, 49, 54 R; 427/97, 98

[56] References Cited

U.S. PATENT DOCUMENTS

| | | | |
|---|---|---|---|
| 2,644,787 | 7/1953 | Bonn et al. | 204/43 |
| 2,791,556 | 5/1957 | Pigeon | 204/248 |
| 3,264,199 | 8/1966 | Fassell, Jr. et al. | 204/38 |
| 3,303,111 | 2/1967 | Peach | 204/38 |
| 3,350,294 | 10/1967 | Hall et al. | 204/290 R |
| 3,367,792 | 2/1968 | Levine | 117/47 |
| 3,389,060 | 6/1968 | Greene | 204/26 |
| 3,394,068 | 7/1968 | Calmon et al. | 204/180 P |
| 3,689,315 | 9/1972 | Quentin et al. | 117/228 |
| 3,764,503 | 10/1973 | Lancy et al. | 204/180 P |
| 3,880,730 | 4/1975 | Wright et al. | 204/46 G |
| 3,933,605 | 1/1976 | Butler et al. | 204/151 |
| 3,945,892 | 3/1976 | James et al. | 204/1 R |
| 3,984,295 | 10/1976 | Kametani et al. | 204/107 |
| 3,994,789 | 11/1976 | Langer et al. | 204/248 |
| 4,085,026 | 4/1978 | Halford | 204/242 |
| 4,101,395 | 7/1978 | Montani et al. | 204/98 |
| 4,105,531 | 8/1978 | Kuo et al. | 204/290 R |
| 4,111,722 | 9/1978 | Horn | 204/180 P |
| 4,142,950 | 3/1979 | Greamer et al. | 204/96 |
| 4,295,951 | 10/1981 | Bommaraju et al. | 204/242 |
| 4,310,405 | 1/1982 | Heller | 204/252 |
| 4,391,891 | 7/1983 | Zeblisky | 427/98 |
| 4,419,192 | 12/1983 | Dahms | 204/15 |

FOREIGN PATENT DOCUMENTS

| | | | |
|---|---|---|---|
| 2252416 | 6/1975 | France | 204/45.1 |
| 283826 | 10/1952 | Switzerland | 204/45.1 |

Primary Examiner—Terryence Chapman
Attorney, Agent, or Firm—Pollock, Vande Sande & Priddy

[57] ABSTRACT

A metal is deposited onto a substrate from an electroless plating solution by providing a first body which comprises the substrate in a plating solution, providing a second body in the plating solution wherein the second body includes a metal which has an electrolytic potential in the plating solution which is different from that of the metal to be plated, and electrically connecting the first body with the second body with an electrically conductive circuit.

19 Claims, 2 Drawing Figures

METHOD OF DEPOSITING A METAL FROM AN ELECTROLESS PLATING SOLUTION

DESCRIPTION

1. Technical Field

The present invention is concerned with a method for depositing a metal onto a substrate from an electroless plating solution. The present invention is especially applicable for depositing copper, nickel, and/or gold onto a desired substrate. The present invention provides a process for regulating the rate of deposition of the desired metal onto the substrate. In addition, the present invention makes it possible to substantially reduce the presence of plating voids from the electroless plating bath.

2. Background Art

The electroless plating of various metals, such as copper and nickel, onto a substrate is well-known in the prior art. For instance, an electroless or autocatalytic copper plating bath usually contains a cupric salt, a reducing agent for the cupric salt, a chelating or complexing agent, and a pH adjuster. In addition, if the surface being plated is not already catalytic for the deposition of the desired metal, a suitable catalyst is deposited on the surface prior to contact with the plating bath. Among the more widely employed procedures for catalyzing a substrate is the use of stannous chloride sensitizing solution and a palladium chloride activator to form a layer of metallic palladium particles.

Although the technology relative to electroless copper plating is continually being improved there still remains room for additional improvement. Certain problems are especially pronounced when preparing articles of very high quality, such as those to be employed in printed circuit applications, e.g., printed circuitboards which contain high-density circuitry and large numbers of holes such as through-holes and blind holes. The problems encountered include the formation of voids on the surface and in the coatings located in the holes. This, in turn, can cause unreliable electrical connections. Moreover, even if the electrical connections initially are adequate, the presence of voids tends to cause the coatings to crack during use of the circuits. During operation, integrated circuitboards tend to expand and contract somewhat. Any discontinuities in the coating represent a prime site for cracking due to the mechanical stress from such expansion and contraction.

Moreover, a major reason for yield loss in electroless plating is the formation of what is known as extraneous copper or nodules. The formation of nodules in unwanted areas on a substrate can result in short-circuiting by forming contact between circuit lines on the substrate. In addition, such processes as providing protective coatings, providing solder, and pin insertion are adversely effected by the presence of nodules on the surface.

Although many of the problems of void formation and/or nodule formation can be avoided by the judicious selection of the bath and the conditions of plating, it would be advantageous and desirable to increase the speed of plating without a concomitant increase in the formation of voids and/or nodules.

SUMMARY OF INVENTION

The present invention provides a method for significantly reducing, if not entirely eliminating, the formation of voids or nodules during plating, from an electroless plating bath. In addition, the present invention provides a method for plating a metal whereby the plating rate can be decreased or increased, as desired.

An especially advantageous aspect of the present invention is the ability to significantly increase the plating rate while, at the same time, avoiding the formation of voids and/or nodules.

The present invention is concerned with a process for depositing a metal onto a substrate from an electroless plating solution. The method includes providing a first body comprising the substrate in the plating solution; providing a second body in the plating solution, wherein the second body comprises a metal having an electrolytic potential in the plating solution which is different from that of the metal to be plated; and electrically and physically connecting the first body with the second body with an electrically conductive circuit.

The present invention also includes, in certain preferred aspects, providing an adjustable resistor in the electrical connecting means between the first body and the second body in order to more closely regulate the desired plating rate.

In another modification of the present invention, a coating of an organic film on top of the metal of the second body is provided.

Another embodiment of the present invention includes separating the first body from the second body by providing a semipermeable membrane or salt bridge between the first and second bodies.

BEST AND VARIOUS MODES FOR CARRYING OUT INVENTION

Figure 1:
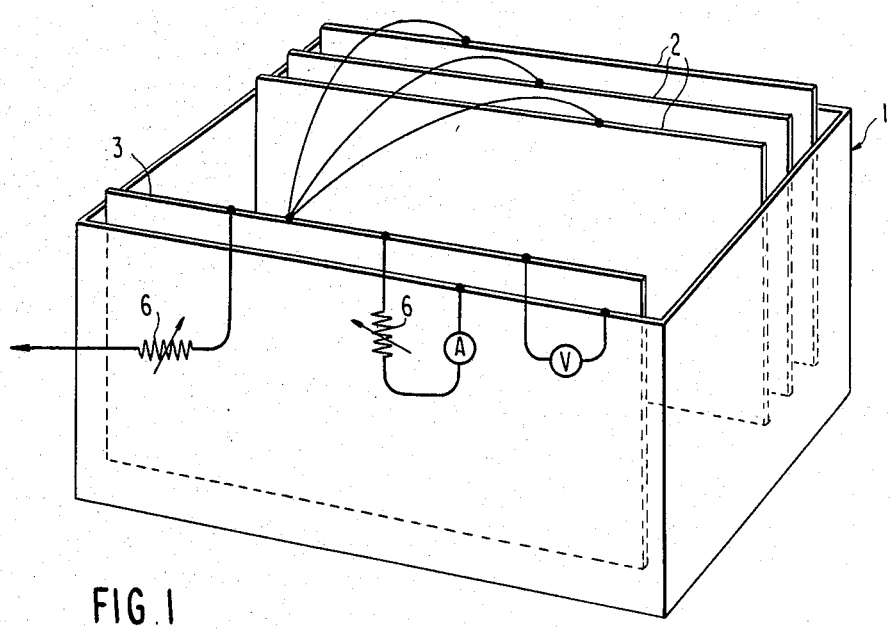
FIG. 1 is a schematic diagram of a plating bath suitable for carrying out the process of the present invention.

According to the present invention, it has been found that improved plating can be achieved by providing, in the plating solution, a body containing a metal which has an electrolytic potential in the plating solution which is different from that of the metal to be plated; and physically and electrically connecting this body with the substrate onto which the desired metal is to be coated by an electrically conductive circuit. Preferably, no externally applied electromotive force is employed. Imposing an external electromotive force tends to cause dissolution of the second body into the bath.

The metal, in order to increase the speed of plating, must be more electrolytically negative than the metal to be plated. It is essential, in carrying out the present invention, that the second body contains material having an electrolytic potential in the plating solution which is different from the metal to be plated in order to generate a current and preferably, to be more electronegative than the metal to be plated in order to increase the plating rate. However, in those instances where it is desired to reduce the rate of plating, the material selected would be less electronegative than the metal to be plated.

In addition, in order for the material of the second body to be suitable in the practice of the present invention, such must not provide a surface for the metal to be plated to plate thereon. In addition, the material of the second body must not dissolve into the electroless plating solution or contain materials which are leached into the solution.

It has been found, according to the present invention, that the use of niobium as the surface layer of the second body, when employing an electroless plating solution for copper, provides all of the necessary characteristics to significantly increase the plating rate while, at the same time, reducing the occurrences of nodules and/or voids. It has also been found, according to the present invention, that titanium can be employed if it is desired to decrease the rate of plating of copper.

In addition, a similar effect can be achieved by providing a second body whereby the metal having the different electrolytic potential in the plating solution than the metal to be plated has an exterior coating of preferably an organic film thereon. The film generally has a thickness from about 1 micron to about 5 microns. The coating permits the reducing agent, such as the formaldehyde, to contact the metal at the second body, but prevents the copper from contacting the metal of the second body and plating thereon. Accordingly, providing the coating makes it possible to use a greater variety of materials for the second body. Some of the preferred materials to be employed when plating copper include platinum, tin, palladium, and nickel.

The coating can be any of a variety of organic coatings which do not dissolve in the plating solution or contain materials which are leachable in the plating solution. Examples of suitable materials are epoxy compositions, phenoxy polymers, polymers of alkylacrylates, and polymers of alkylmethacrylates, such as polymers of methylmethacrylate, available from DuPont under the trade designation "T168". "T168" is a negative photoresist material which includes a copolymer of methylmethacrylate and crosslinkable monomeric units. Negative photoresists from a copolymer of methylmethacrylate are disclosed in U.S. Pat. Nos. 3,448,089 and 3,469,982 to Celeste. The coating should be porous enough to permit the reducing agent to diffuse through it. The maximum pore size of the coating is the size of the complex of metal ion and chelating agent formed in the solution. Such pore sizes can be determined without undue experimentation for the particular bath employed.

Another embodiment for carrying out the present invention is to provide a salt bridge or semipermeable membrane between the first body, upon which the plating is to occur, and the second body. By providing a salt bridge or semipermeable membrane, the salts of the metal to be deposited can be maintained in the compartment adjacent the substrate or body upon which the plating is to occur, whereas the reducing agent can be placed in the compartment adjacent the second body. The salt bridge or semipermeable membrane allows for ion transport between the two compartments, except for the metal to be plated, the complexing agent, and the reducing agent. Some suitable semipermeable membranes are epoxy polymers, phenoxy polymers, polymers of alkyl acrylates, and polymers of alkyl methacrylates in the form of supported structures. The salt bridge can contain a porous support or carrier such as fritted glass or glass tube and an electrolyte such as a salt such as sodium sulfate which can diffuse through the support to provide for balancing the charge on both sides of the bridge.

In all of the embodiments, in accordance with the present invention, it is believed that the particular arrangement provides for the oxidation of the reducing agent on the metal of the second body which, in the case of formaldehyde, results in generation of hydrogen there. Moreover, the metal ions of the metal to be plated do not react at the material of the second body, but instead, react at the surface of the first body. This is quite different and advantageous from usual electroless plating whereby the anodes and cathodes exist simultaneously on the same surface, but alternate during the plating. In other words it is believed that during electroless plating, in accordance with the present invention oxidation of the reducing agent and reduction of the metal ions of the metal to be plated occurs alternately rather than simultaneously. It is believed that if the surface, in normal electroless plating, is homogeneous, the sites for oxidation and reduction alternate between anodic and cathodic as the plating occurs, thereby yielding a uniformly plated surface. However, if the surface is not entirely homogeneous, then localized anodic sites may become fixed which, in turn, cause plating voids. Moreover, since gases such as hydrogen gas are generated at the surface to be plated, the presence of the gas can likewise cause degradation in the quality of the copper plated by being entrapped in the copper lattice.

The added second metal is preferably one that provides a voltage differential between the second body and the surface to be plated of about 70 to about 100 millivolts. Usually the ratio of the relative surface area of the added second metal to that of the surface to be plated is not more than about 40:1 and preferably not more than about 20:1 and usually is at least about 0.5:1 and preferably about 1:1. The higher this ratio, the greater the change in the plating speed.

Examples of suitable metals which can be plated according to the present invention include copper, nickel, and gold. Of course, if desired, mixtures of these metals can be plated. The preferred metal is copper.

The surface upon which the copper is plated must be catalytic for the deposition of copper. In the event the surface being plated is not already catalytic for the deposition of the copper, a suitable catalyst is deposited on the surface prior to contact with the plating bath. Among the more widely employed procedures for catalyzing a substrate is the use of a stannous chloride sensitizing solution and a palladium chloride activator to form a layer of metallic palladium particles. One such surface is an epoxy-fiberglass laminate containing already deposited copper in those areas where copper is to be plated and/or being seeded with a stannous chloride and palladium chloride activating system.

The preferred copper electroless plating baths and their method of application are disclosed in U.S. Pat. Nos. 3,844,799 and 4,152,467, disclosures of which are incorporated herein by reference.

The copper electroless plating bath is generally an aqueous composition which includes a source of cupric ion, a reducing agent, a complexing agent for the cupric ion, and a pH adjustor. The plating baths also preferably include a cyanide ion source and a surface-active agent. The cupric ion source generally used is a cupric sulfate or a cupric salt of the complexing agent to be employed.

When employing cupric sulfate, it is preferred to use amounts from about 3 to about 15 gram/liter and most preferably, about 8 to about 12 gram/liter. The most common reducing agent employed is formaldehyde which, in the preferred aspects of the present invention, is used in amounts from about 0.7 to about 7 gram/liter and most preferably, from about 0.7 to about 2.2 gram/liter.

Examples of some other reducing agents include formaldehyde precursors or derivatives such as paraformaldehyde, trioxane, dimethylhydantoin, glyoxal; borohydrides, such as alkali metal borohydrides (sodium and potassium borohydride) and substituted borohydrides such as sodium trimethoxy borohydride; boranes, such as amine borane (isopropyl amine borane and morpholine borane).

Examples of some suitable complexing agents include Rochelle salts, ethylene diamine tetraacetic acid, the sodium (mono-, di-, tri-, and tetra-sodium) salts of ethylene diamine tetraacetic acid, nitrolotetraacetic acid and its alkali salts, gluconic acid, gluconates, triethanol amine, glucono (gamma)-lactone, modified ethylene diamine acetates, such as N-hydroxyethyl, ethylene diamine triacetate. In addition, a number of other suitable cupric complexing agents are suggested in U.S. Pat. Nos. 2,996,408; 3,075,856; 3,075,855; and 2,938,805. The amount of complexing agent is dependent upon the amount of cupric ions present in the solution and is generally from about 20 to about 50 gram/liter, or in a 3-4 fold molar excess.

The plating bath can also include a surfactant which assists in wetting the surface to be coated. A satisfactory surfactant is, for instance, an organic phosphate ester available under the trade designation "Gafac RE-610". Generally, the surfactant is present in amounts from about 0.02 to about 0.3 gram/liter. In addition, the pH of the bath is also generally controlled for instance, by the addition of a basic compound such as sodium hydroxide or potassium hydroxide in the desired amount to achieve the desired pH. The preferred pH of the electroless plating bath is between 11.6 and 11.8.

Also, preferably, the plating bath contains a cyanide ion and most preferably, contains about 10 to about 25 milligrams per liter to provide a cyanide ion concentration in the bath within the range of 0.0002 to 0.0004 molar. Examples of some cyanides which can be employed according to the present invention are the alkali metal, alkaline earth metal, and ammonium cyanides. In addition, the plating bath can include other minor additives as is known in the art.

The preferred plating baths employed have a specific gravity within the range of 1.060 to 1.080. Moreover, the temperature of the bath is preferably maintained between 70° C. and 80° C. and most preferably, between 70° C. and 75° C. For a discussion of the preferred plating temperature coupled with the preferred cyanide ion concentrations, see U.S. Pat. No. 3,844,799.

Also, it is preferred to maintain the $O_2$ content of the bath between 2 ppm and 4 ppm and preferably, about 2.5 to about 3.5 ppm, as discussed in U.S. Pat. No. 4,152,467. The $O_2$ content can be controlled by injecting oxygen and an inert gas into the bath.

The overall flow rate of the gases into the bath is generally from about 1 to about 20 SCFM per thousand gallons of bath and preferably, from about 3 to about 8 SCFM per thousand gallons of bath.

Reference to FIG. 1 illustrates an arrangement for carrying out the process of the present invention. In particular, numeral 1 refers to the container containing plating bath and substrate to be plated. The substrates to be plated are represented by numeral 2. A surface having a potential which is electrolytically more negative than substrate 2 is represented by numeral 3. This substrate, in the case of plating of copper, is preferably platinum, tin, palladium, or nickel which is coated with a thin coating of about 1 micron thick of a polymer of methylmethacrylate or is niobium. Other coatings include epoxy and phenoxy type coatings. This substrate is referred to as the anode for convenience. The anode is connected to the substrate upon which the copper is to be coated by an electrically conductive circuit. In the illustration, the conductive path connector is copper wire. If desired, the conductive circuit could be provided by directly contacting the niobium substrate with substrate 2. This could be done for instance, by constructing the container 1 from niobium. In addition, variable resistors 6 are attached to the anode in order to regulate the current flow from the anode to the substrates 2 to be coated. The resistors can be connected to ground or to dummy plating panels (not shown). In addition, in order to regulate the plating, the arrangement preferably includes an ammeter and voltmeter connected from the anode to the substrate to be coated. In order to facilitate avoiding void formation, the EMIX of the composition is monitored during the plating by the voltmeter and is maintained between about minus 650 and about minus 700 millivolts by adding material such as source of cupric ion or reducing agent to the bath.

Figure 2:
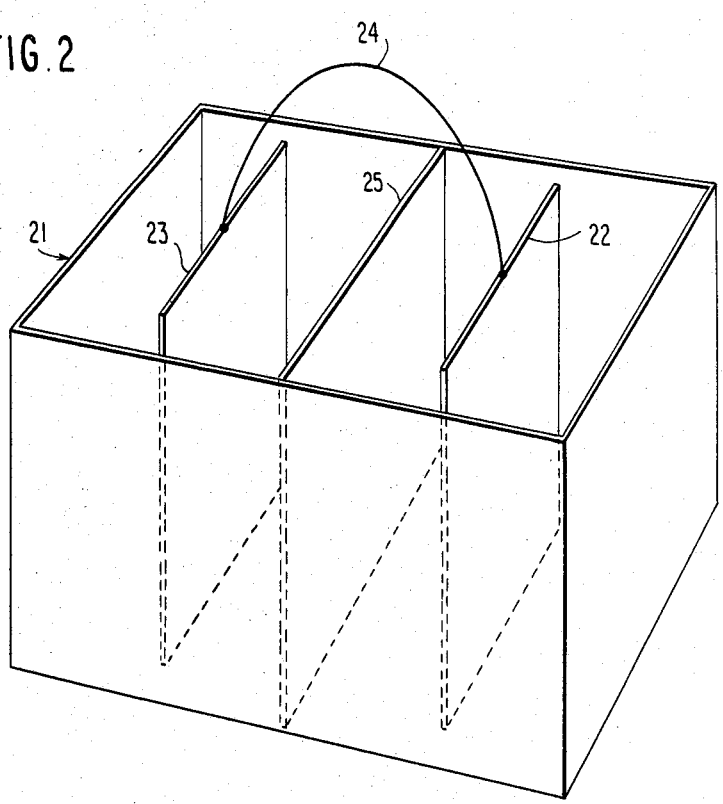
FIG. 2 is a schematic diagram of a plating bath capable of carrying out another embodiment of the present invention.

Reference to FIG. 2 illustrates another arrangement for carrying out the present invention. In particular, numeral 21 refers to the container containing plating bath and substrate to be plated. The substrate to be plated is represented by numeral 22. A surface having a potential which is electrolytically more negative than substrate 22 is represented by numeral 23. This substrate, in the case of plating of copper, is preferably niobium, platinum, tin, palladium, or nickel. In this embodiment, the substrate 23 need not be coated, but could be if desired. This substrate is referred to as the anode for convenience. The anode is physically connected to the substrate upon which the copper is to be coated by an electrically conductive path or circuit. In the illustration, such conductive path is represented by numeral 24, which is a copper wire.

Separating the substrate 22 and the substrate 23 is a semipermeable membrane 25 or preferably a salt bridge. The membrane or salt bridge 25 prevents transport of the reducing agent, metal to be plated, and complexing agent therethrough while allowing transport of the other ions therethrough.

What is claimed is:

1. A method for depositing a first metal onto a substrate from an electroless plating bath wherein there is no electromotive force which is applied external of said plating bath and which comprises providing in said plating bath a first body comprising said substrate; providing in said plating bath a second body, said second body comprising a second metal having an electrolytic potential in said plating bath different from that of the said first metal to be deposited; and electrically and physically connecting said first body with said second body with an electrically conductive circuit, and wherein said second body is of a material which does not provide a surface for said first metal to deposit thereon and does not dissolve into the electroless plating bath and does not contain materials which are leached into the electroless plating bath and wherein said first body and said second body are separated from each other in said plating bath only by said plating bath.

2. The method of claim 1 wherein said metal is copper and said second body comprises a metal having an electrolytic potential more negative than copper.

3. The method of claim 2 wherein said second body comprises niobium.

4. The method of claim 1 which further comprises providing an adjustable resistor in the electrical connecting means between the first body and second body.

5. The method of claim 1 wherein said second body comprises a metal having an electrolytic potential more negative than the metal to be deposited.

6. The method of claim 5 which further comprises providing a coating of an organic polymer on said metal of said second body.

7. The method of claim 6 wherein the thickness of said coating is about 1 to about 5 microns.

8. The method of claim 7 wherein said metal is copper and said second body contains a metal selected from the group of platinum, tin, palladium, nickel, and niobium.

9. The method of claim 1 wherein said second body is physically spaced apart from said first body.

10. The method of claim 1 wherein the voltage differential between said second body and said first body is about 70 to about 100 millivolts.

11. The method of claim 1 wherein the ratio of the surface area of the second body to the first body is no greater than about 40:1.

12. The method of claim 11 wherein said ratio is no greater than about 20:1.

13. The method of claim 11 wherein said ratio is at least about 0.5:1.

14. The method of claim 11 wherein said ratio is about 1:1.

15. The method of claim 1 wherein said metal is copper and said second body contains titanium.

16. The method of claim 1 wherein the metal of said second body provides a voltage differential between the second body and the surface to be plated of about 70 to about 100 millivolts.

17. The method of claim 1 wherein said electroless plating bath is an aqueous copper plating bath which contains a cupric salt, a reducing agent for said cupric salt, a chelating agent, and a pH adjuster.

18. The method of claim 17 wherein said cupric salt is cupric sulfate in an amount of about 3 to about 15 grams/liter and said reducing agent is formaldehyde in an amount of about 0.7 to about 7 grams/liter.

19. The method of claim 18 wherein the plating bath has a pH of between 11.6 and 11.8.

* * * * *